United States Patent
Verma et al.

(10) Patent No.: US 7,308,632 B1
(45) Date of Patent: Dec. 11, 2007

(54) METHOD AND APPARATUS FOR MEASURING DUTY CYCLE DISTORTION ON AN INTEGRATED CIRCUIT

(75) Inventors: Himanshu J. Verma, Mountain View, CA (US); Paul T. Nguyen, Fremont, CA (US); Paul A. Swartz, Hillsborough, CA (US)

(73) Assignee: Xilinx, Inc., San Jose, CA (US)

( * ) Notice: Subject to any disclaimer, the term of this patent is extended or adjusted under 35 U.S.C. 154(b) by 258 days.

(21) Appl. No.: 11/201,462

(22) Filed: Aug. 11, 2005

(51) Int. Cl.
*G01R 31/28* (2006.01)
*H03K 3/017* (2006.01)
*H03K 7/08* (2006.01)
*H03H 11/26* (2006.01)

(52) U.S. Cl. .................. 714/731; 327/175; 327/265
(58) Field of Classification Search ............ None
See application file for complete search history.

(56) References Cited
U.S. PATENT DOCUMENTS 6,219,305 B1 * 4/2001 Patrie et al. ............ 368/113

OTHER PUBLICATIONS

U.S. Appl. No. 11/061,697, filed Feb. 18, 2005, Verma et al.
U.S. Appl. No. 10/255,502, filed Sep. 26, 2003, Lesea.
U.S. Appl. No. 10/402,837, filed Mar. 27, 2003, Lesea.
U.S. Appl. No. 11/201,688, filed Aug. 11, 2005, Verma.

* cited by examiner

*Primary Examiner*—Cynthia Britt
*Assistant Examiner*—John J. Tabone, Jr.
(74) *Attorney, Agent, or Firm*—Leroy D. Maunu; Lois D. Cartier

(57) ABSTRACT

A method and apparatus for the utilization of on-chip, programmable resources to implement a signal distortion characterization circuit. Programmable logic resources, such as programmable delay lines and phase shifting circuits, are utilized to sample the logic value of a test signal after the test signal has traversed a path under test (PUT). A counter is used to determine the number of logic high valued samples and the number of logic low valued samples during a test period. A ratio is then taken to determine the resulting duty cycle for the test period.

20 Claims, 4 Drawing Sheets

METHOD AND APPARATUS FOR MEASURING DUTY CYCLE DISTORTION ON AN INTEGRATED CIRCUIT

FIELD OF THE INVENTION

The present invention generally relates to testing on Integrated Circuits (ICs), and more particularly to ICs configured to perform self-diagnostic testing.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is determined by the data bits used to configure the reconfigurable resources of the device. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

PLDs often utilize global signal distribution resources that typically span the full width and/or the full height of the PLD. Such resources, often denoted as long line resources, are employed to propagate global signals to all portions of the PLD. The signals may include global clock signals that may be used to clock the sequential resources that are distributed across the entire device, such as the CLBs, BRAM, IOBs, and digital clock managers (DCMs). Other signals, such as the configuration data stream, may be propagated by the long line resources so that the memory cells that define the logic functions performed by the PLD may be programmed.

The long line resources, however, may add some form of distortion to the clock or data signals as they propagate from source to destination. Signal distortion may be caused by the particular transmission characteristics that are associated with the long line resources, such as distributed capacitive or inductive reactance, which may cause variations in propagation delay. Other causes of signal distortion may be introduced by combinatorial logic that may be associated with the long line resource, such as buffers or inverters. Such combinatorial logic may exhibit non-symmetric slew rates when propagating a logic low-to-high transition as compared to the propagation of a logic high-to-low transition. The ability to deterministically ascertain the characteristics of signal distortion within PLDs, therefore, continues to be desirable.

SUMMARY

To overcome limitations in the prior art, and to overcome other limitations that will become apparent upon reading and understanding the present specification, various embodiments of the present invention disclose an apparatus and method for deterministically ascertaining duty cycle distortion within an IC.

In accordance with one embodiment of the invention, a method of measuring a duty cycle of a test signal comprises generating a test signal having a first duty cycle, transmitting the test signal through a path under test (PUT), generating a sampling signal having a programmably variable phase offset with respect to the test signal, sampling the test signal received from the PUT at instances defined by progressively delayed transitions of the sampling signal, and measuring a second duty cycle from accumulated samples of the received test signal.

In accordance with another embodiment of the invention, a duty cycle measurement circuit comprises a clock generator that is adapted to provide a test signal having a first duty cycle. The duty cycle measurement circuit further comprises a signal path that is coupled to receive the test signal and is adapted to provide the test signal having a second duty cycle. The duty cycle measurement circuit further comprises a delay circuit that is coupled to receive the test signal from the clock generator and is adapted to provide a sampling clock in response to the test signal, where the sampling clock exhibits a programmable delay offset relative to the test signal. The duty cycle measurement circuit further comprises a sampling circuit that is coupled to receive the test signal from the signal path and the sampling clock from the delay circuit and is adapted to sample a logic level of the test signal at instances defined by progressively delayed transitions of the sampling clock.

In accordance with another embodiment of the invention, a method of configuring a programmable logic device (PLD)

to measure duty cycle distortion comprises defining a path under test (PUT) within the PLD, configuring logic resources within the PLD to implement a test circuit coupled to the PUT, and activating the test circuit to transmit a test signal to an input of the PUT and to sample the test signal at the output of the PUT at progressively delayed sampling instances relative to the test signal. The samples are compared to an expected sample set to determine the measure of duty cycle distortion.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
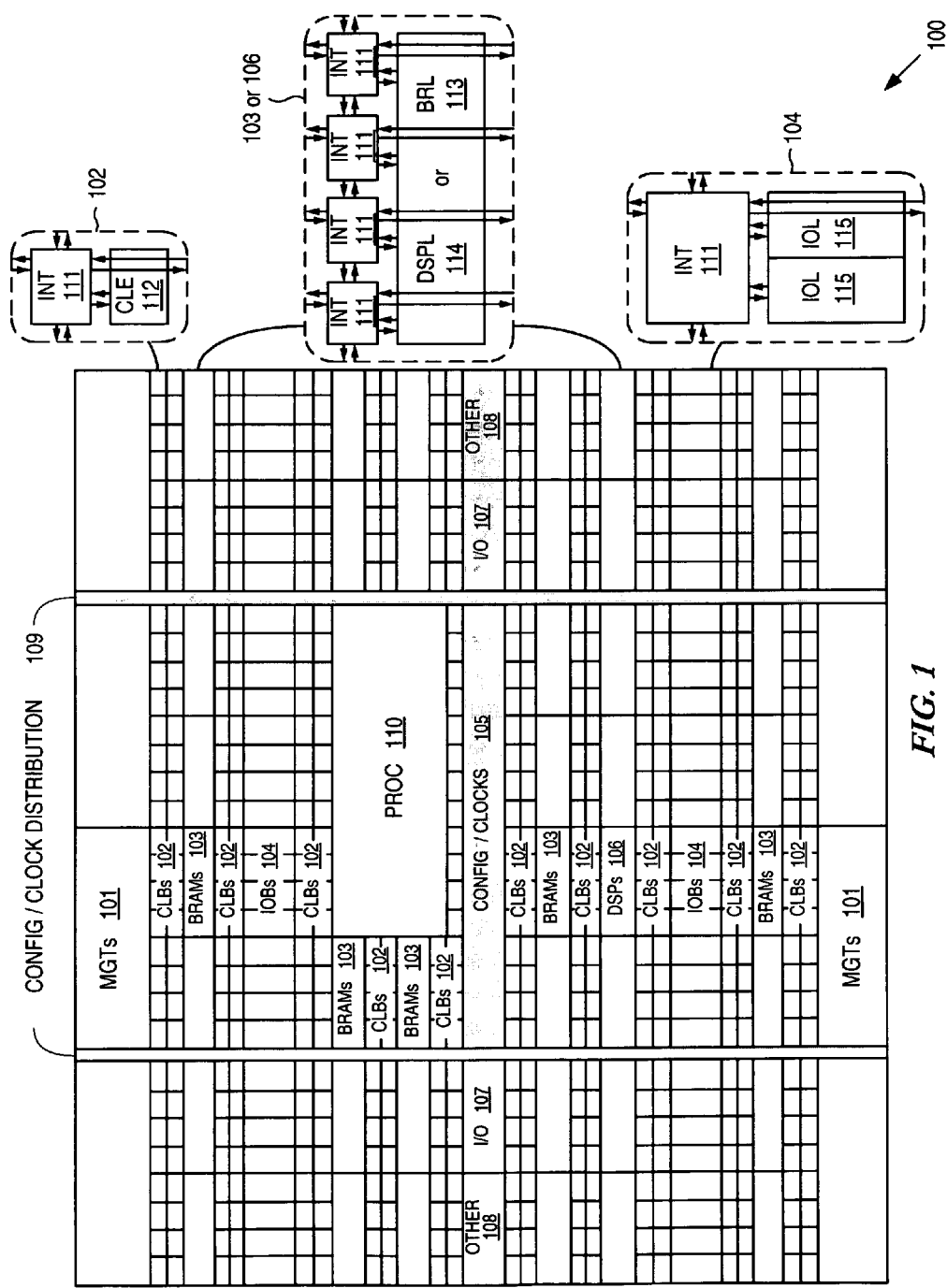
FIG. 1 illustrates an exemplary Field Programmable Gate Array (FPGA) architecture.

Generally, the various embodiments of the present invention may be applied to the field of integrated circuits (ICs) of which PLDs are a subset. In particular, the various embodiments of the present invention provide a method and apparatus for the utilization of on-chip, programmable resources to implement a signal distortion characterization circuit. Programmable logic resources, such as programmable delay lines and phase shifting circuits, are utilized to obtain estimates of, for example, the duty cycle of a test signal after the test signal has traversed a path under test (PUT).

In one embodiment, a signal under test (SUT) having a particular duty cycle, i.e., the ratio of the pulse duration to the pulse period, is introduced at the input of the PUT. At an output of the PUT, a sampling circuit is configured to receive the SUT from the PUT and then sample the SUT at programmably delayed/advanced sampling instances. The sampling instances are programmably delayed/advanced with respect to a phase of the SUT, such that an entire period, i.e., 360 degrees, of the SUT is traversed.

Once the test period is completed, a set of sampled data may then be analyzed via, for example, a counter to determine the number of sampling instances that the SUT exhibited a logic high magnitude and the number of instances that the SUT exhibited a logic low magnitude during the test period. By taking a ratio of the number of logic high magnitude samples observed during the test period to the total number of magnitude samples observed during the test period, a measurement of the SUT's duty cycle, as received from the PUT, may be estimated. By comparing the SUT's duty cycle as measured at the output of the SUT to the SUT's duty cycle prior to entry into the SUT, an estimate of the duty cycle distortion caused by the PUT may be ascertained.

Due to the programmability of the PLD, a plurality of PUTs may be defined for test. For example, global clock resources are often employed within PLDs to provide a dedicated interconnect network that is designed to be accessible by the clock inputs of the various reconfigurable resources of the PLD. Thus, during configuration of the PLD, for example, a sampling circuit may be placed at one end of a particular clock interconnect, while a clock generation resource is placed at the other end of the clock interconnect. Placement of an associated programmable delay device during configuration then facilitates the measurement of any duty cycle distortion that may be caused by the clock interconnect as is discussed in more detail below.

As noted above, advanced ICs, such as FPGAs, can include several different types of programmable logic blocks in the array. For example, FIG. 1 illustrates an IC that exemplifies FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104.

For example, a CLB 102 may include a Configurable Logic Element CLE 112 that may be programmed to implement user logic plus a single programmable interconnect element INT 111. A BRAM 103 can include a BRAM logic element (BRL 113) in addition to one or more programmable interconnect elements. In accordance with various embodiments of the present invention, therefore, interconnect elements INT 111 may be used to route a signal under test and a programmably delayed sampling clock through almost any path of FPGA 100. Through the use of associated sampling circuitry, therefore, virtually any path within FPGA 100 may be analyzed for duty cycle distortion, subject to various restrictions of placement and routing that may exist with the design tool/FPGA target being utilized.

Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111.

As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Various embodiments of the present invention may then be employed, for example, to identify and quantify any duty cycle distortion that may be caused by the long line resources extending along the horizontal or columnar areas as illustrated, for example, by shaded areas 105 and 109.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs.

Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

Figure 2:
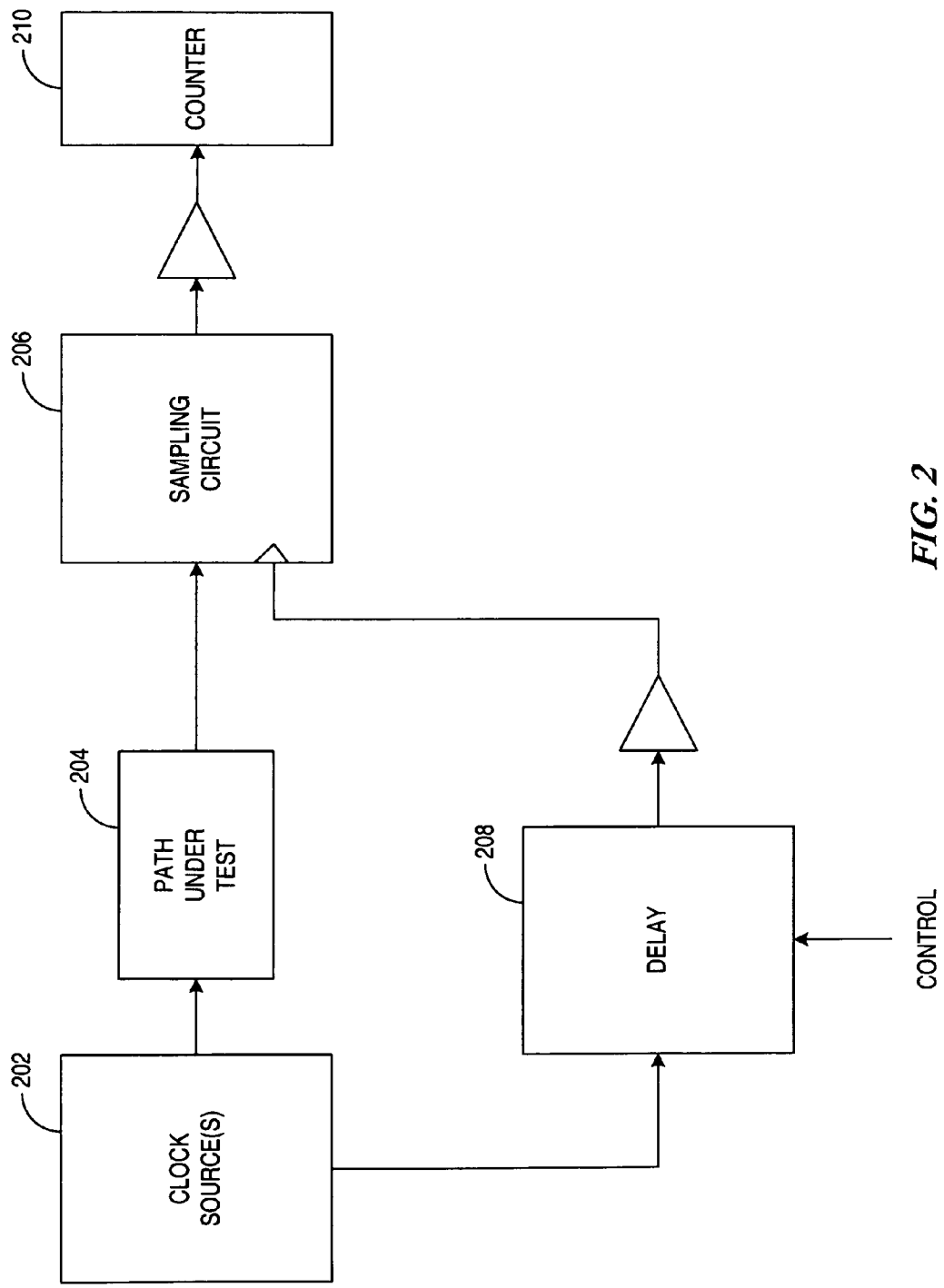
FIG. 2 illustrates an exemplary block diagram of a reconfigurable test circuit in accordance with one embodiment of the present invention.

Turning to FIG. 2, an exemplary block diagram of a reconfigurable test circuit in accordance with one embodiment of the present invention is illustrated. Clock source(s) 202 may include one or more clock generators, resulting in one or more clock signals, one being a test signal having a known duty cycle to Path Under Test (PUT) 204. Clock source(s) 202 also provides an additional signal to delay block 208, which may or may not be derived from the signal provided to PUT 204. Delay circuit 208 receives signal CONTROL to facilitate the ability to apply a known phase offset to the signal received from clock source 202. As such, the signal supplied by delay circuit 208 to sampling circuit 206 may be advanced/delayed in phase increments as defined by signal CONTROL.

In one embodiment of the present invention, clock source(s) 202 and delay circuit 208 may be implemented within a single circuit. In particular, digital clock managers (DCMs) available in some Virtex® FPGAs from Xilinx Inc. of San Jose, Calif., allow the production of clock signals exhibiting fine-grain phase shifts with respect to an input clock signal. In particular, the phase of the clock signal generated by the DCM may be advanced or retarded with respect to the phase of the input clock signal to the DCM in increments equal to $1/256^{th}$ of a clock period. In such an instance, therefore, the phase of the output signal may be advanced or retarded by 1.4 degrees with respect to one cycle of the input clock signal.

In an alternative embodiment of the present invention, an IOB may be utilized to provide the delay function as illustrated by delay circuit 208. In some Xilinx Virtex® FPGAs, a programmable absolute delay element may be instantiated within an IOB. The delay element is a 64-tap, wrap-around delay element with a fixed tap resolution that is proportional to a control clock. If the control clock frequency is 200 MHz, for example, then the control clock period is 5 nanoseconds (nS), which in turn provides a delay resolution of 5 nS/64, or 78.125 picoseconds (pS).

Sampling circuit 206 receives at its data input, the signal from PUT 204, which originates at clock source 202. Additionally, sampling circuit 206 receives the programmably delayed clock signal from delay circuit 208 at its sample clock input. PUT 204 is generally configured as signal routing and interconnect, as discussed above, which may or may not contain combinatorial logic elements and generally does not contain registered logic components. PUT 204, therefore, exhibits a certain amount of propagation delay, $T_{rising\_edge}$, such that a rising edge of a clock signal incident to the input of PUT 204 results in a rising edge incident to the input of sampling circuit 206 that is delayed by $T_{rising\_edge}$ seconds. Similarly, a falling edge of a clock signal incident to the input of PUT 204 results in a falling edge incident to the input of sampling circuit 206 that is delayed by $T_{falling\_edge}$ seconds, where $T_{rising\_edge}$ and $T_{falling\_edge}$, may or may not be the same.

Thus, PUT 204 may impose an amount of delay on the SUT, which is dependent upon the logic transitions exhibited by the SUT during the propagation time from clock source(s) 202 to sampling circuit 206. If $T_{rising\_edge}$ and $T_{falling\_edge}$ are equal, for example, then the delay through PUT 204 does not depend upon the polarity of the logic transitions and is, therefore, a relatively constant value. If, on the other hand, $T_{rising\_edge}$ and $T_{falling\_edge}$ are not equal, then the delay through PUT 204 does depend upon the polarity of the logic transitions and is, therefore, a relatively variable value.

In operation, sampling instances of sampling circuit 206 occur at, for example, rising edge transitions of the sample clock received from delay circuit 208 during a test period. The logic value of the SUT that is incident to the data input of sampling circuit 206 during each rising edge transition is then latched by sampling circuit 206 and then counted by counter 210. After the test period is expired, a ratio of the number of logic high levels counted to the total number of logic levels counted is then taken to calculate the measured duty cycle.

In one embodiment, the period of the SUT may be equivalent to the period of the sampling clock received from delay circuit. In such an instance, only a single sample of the SUT is possible for each cycle of the SUT. Thus, if the test period extends for an amount of time equal to 64 cycles of the SUT, then a total of 64 samples will be collected. Alternately, if the test period extends for an amount of time equal to 256 cycles of the SUT, then a total of 256 samples will be collected. In general, therefore, the number of samples collected is equivalent to the number of SUT cycles that transpired during the test period, when the period of the SUT and the sampling clock are the same.

In other embodiments, however, the sampling clock period is not equivalent to the SUT period and further may be greater than, or less than, the SUT period. In such instances, however, the relative periods of the SUT and the sampling clock must be known in order to correctly correlate the test data as gathered by counter 210 into duty cycle distortion measurements. In any instance, the SUT and the sampling clock should be phase coherent with one another, so that the delay increments exerted upon the sampling clock may be accurately correlated with the associated phase offsets relative to the SUT.

Figure 3:
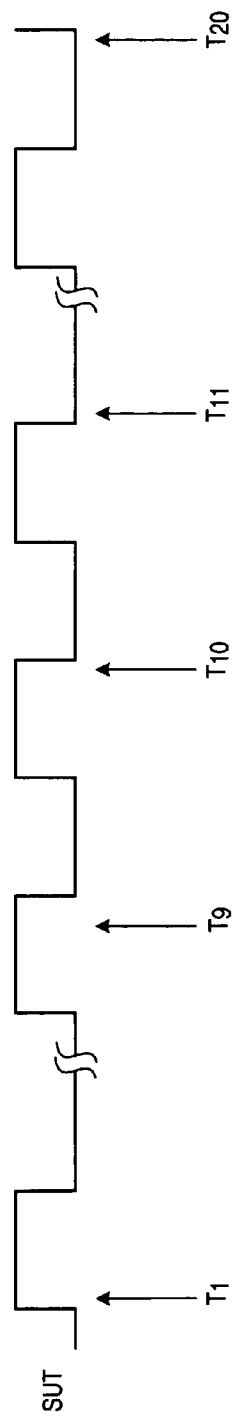
FIG. 3 illustrates an exemplary timing diagram as may be generated by the reconfigurable test circuit of FIG. 2.
Figure 4:
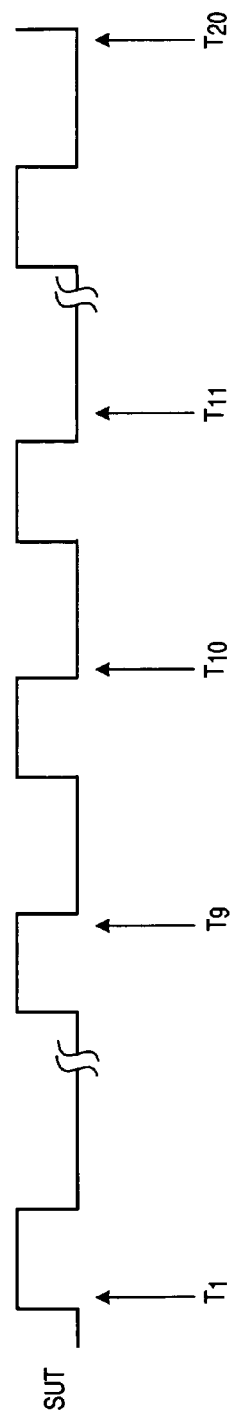
FIG. 4 illustrates an alternative timing diagram as may be generated by the reconfigurable test circuit of FIG. 2.
Figure 5:
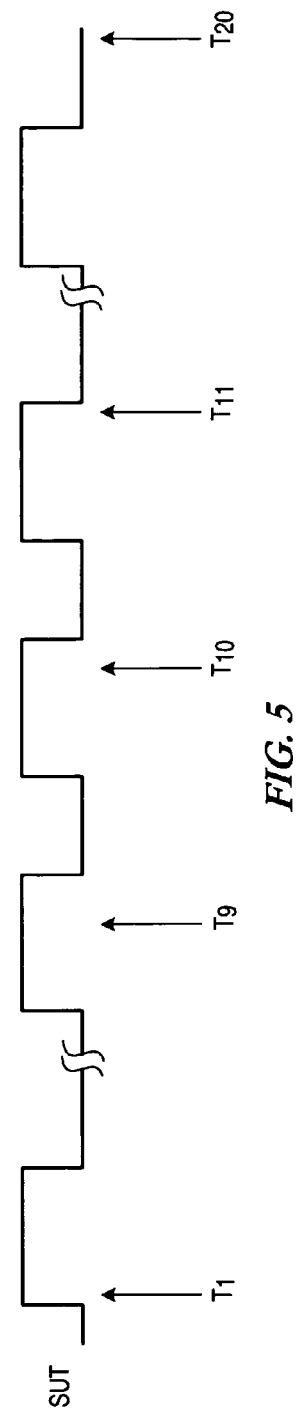
FIG. 5 illustrates an alternative timing diagram as may be generated by the reconfigurable test circuit of FIG. 2.

Turning to FIGS. 3-5, exemplary timing diagrams are illustrated, in which sampling instances T1-T20 denote, for example, progressively delayed rising edge transitions of the sampling clock received by sampling circuit 206 from delay circuit 208. As can be seen, each rising edge transition occurs at a different location relative to the phase of the SUT. As discussed above, only one rising edge transition of the sampling clock occurs for each cycle of the SUT, when the period of the SUT and the sampling clock are equivalent. It should be noted, however, that the period of the SUT and the sampling clock are not necessarily equivalent and that the sampling clock period may be much smaller than the period of the SUT.

In such an instance, therefore, rising edge T1 occurs at a first cycle of the SUT, rising edge T2 occurs at a second cycle of the SUT, rising edge T3 occurs at a third cycle of the SUT, etc., such that 20 cycles of the SUT transpire in order to capture 20 samples of the SUT at sampling instances T1-T20.

Sampling instances T1-T20 are separated in time by the period of the sampling clock plus the total delay implemented, where the total delay implemented is equivalent to the amount of delay being implemented by delay circuit 208. If, for example, the frequency of the SUT is 200 MHz, then one period of the SUT is equal to 5 nS. Given that sampling instances T1-T20 span a full period of the SUT, then each sampling instance is separated by 0.25 nS, which is to say that the delay increment implemented by delay circuit 208 is equal to 0.25 nS when 20 sampling instances are used to sweep a 360 degree cycle of the SUT.

It can be seen that the number of sampling instances may be increased to obtain a finer resolution. In particular, given that the delay element of an IOB is used to implement delay circuit 208, for example, then 64 delay increments may be possible. As such, sampling instances T1-T64, separated by 78.125 pS (5 nS/64), are used to sweep a 360 degree cycle of the SUT. Using the IOB, however, the delay increment values are controlled using a control clock at 200 MHz to obtain the 5 nS period. Alternatively, if the phase offset capability of a DCM is used to implement delay circuit 208, for example, then 256 delay increments may be possible. As such, sampling instances T1-T256, separated by 19.53 pS (5 nS/256), are used to sweep a 360 degree cycle of the SUT.

Turning to FIG. 3, sampling instances T1-T20 are shown relative to several cycles of the SUT. As discussed above, sampling instance T1 occurs during the first cycle of the SUT, sampling instance T2 occurs during the second cycle of the SUT, etc. At each cycle, the delay implemented by delay circuit 208 is increased, for example, by 0.25 nS, given that a 20 delay increment resolution over a 5 nS period is used. The first sampling instance, e.g., T1, may be conducted with 0.25 ns delay (e.g., from the SUT's rising edge in FIG. 3), such that the SUT's rising edge incident to the data input of sampling circuit 206 occurs just prior to the rising edge of the sampling clock received from delay circuit 208. In this instance, the SUT is at a logic high value, thus counter 210 registers a count of one logic high value at the beginning of the test period. Sampling instances T2-T10, corresponding to delay values of 0.5 nS (from the SUT's rising edge) to 2.5 nS (from the SUT's rising edge, e.g., T10 in FIG. 3), respectively, result in 9 additional logic high value counts. Thus, after 10 cycles of the SUT, a total of 10 logic high values are counted for delay values between 0 and 2.5 nS, or half of one test period.

Sampling instances T11 through T20 occur during the second half of the test period. In this instance, it can be seen that a total of 10 logic low values are counted for delay values between 2.75 nS (from the SUT's rising edge, e.g., T11 in FIG. 3) to 5 nS (from the SUT's rising edge, e.g., T20 in FIG. 3) during the second half of the test period. Thus, during the entire test period, a total of 10 logic high values and 10 logic low values are counted. Taking a ratio of the logic high value count to the total number of logic counts taken during the test period yields a 50% duty cycle measurement.

Thus, FIG. 3 is representative of a timing diagram that relates to a PUT that exerts no duty cycle distortion, or at least, no measurable duty cycle distortion, when using a 0.25 nS delay resolution. In this case, duty cycle distortion is measured by comparing the number of logic high values counted to an expected number of logic high values to determine an amount of distortion exerted by the PUT. Since 10 logic values are counted and 10 logic high values are expected, then no duty cycle distortion is measured.

It should be noted, that counter 210 may be configured as an on-chip resource, or conversely, may exist as a portion of test equipment including a processor external to the chip under test. Providing counter 210 as an on-chip resource, provides a test circuit that is totally encapsulated on-chip. Furthermore, processor 110 of FIG. 1 may be configured to execute test code that defines the built-in test (BIT) to be executed on-chip. In particular, processor 110 may execute test code, which provides the necessary control signals to exercise one or more PUTs over a given test period for duty cycle measurements. Once the test period expires, the results may be calculated and formatted for upload to an entity external to the chip.

Turning to FIG. 4, a timing diagram is illustrated that relates to a PUT that exerts negative duty cycle distortion on signals propagating through it. In particular, over an equivalent test period as discussed above in relation to FIG. 3, it can be seen that a total of 9 logic high values are counted and a total of 11 logic low values are counted, resulting in a duty cycle measurement of 45% (9/20=45%). This is so, due to the fact that the duty cycle distortion has caused sampling instance T10 to register a logic low valued sample as compared to the normally logic high valued sample as illustrated in FIG. 3.

In such an instance, it can be seen that the PUT exerts a duty cycle distortion of −5%, given that the SUT entered the PUT at a 50% duty cycle and that the delay increments implemented by delay circuit 208 are accurate. In this instance, the duty cycle distortion is measured by a comparison of the number of logic high values counted as compared to the expected number of logic high values. Since the number of logic high values counted is one less than the number expected, then an error of −1/20, or −5% duty cycle distortion, is measured.

Turning to FIG. 5, a timing diagram is illustrated that relates to a PUT that exerts positive duty cycle distortion. In particular, over an equivalent test period as discussed above in relation to FIGS. 3 and 4, it can be seen that a total of 11 logic high values will be counted and a total of 9 logic low values will be counted, resulting in a duty cycle measurement of 55% (11/20=55%). This is so, due to the fact that the duty cycle distortion has caused sampling instance T11 to register a logic high valued sample as compared to the normally logic low valued sample as illustrated in FIG. 3.

In such an instance, it can be seen that the PUT exerted a duty cycle distortion of +5%, given that the SUT entered the PUT at a 50% duty cycle and that the delay increments implemented by delay circuit 208 are accurate. In this instance, the duty cycle distortion is measured by a comparison of the number of logic high values counted as compared to the expected number of logic high values. Since the number of logic high values counted is one more than the number expected, then an error of +1/20, or +5% duty cycle distortion, is measured.

Figure 6:
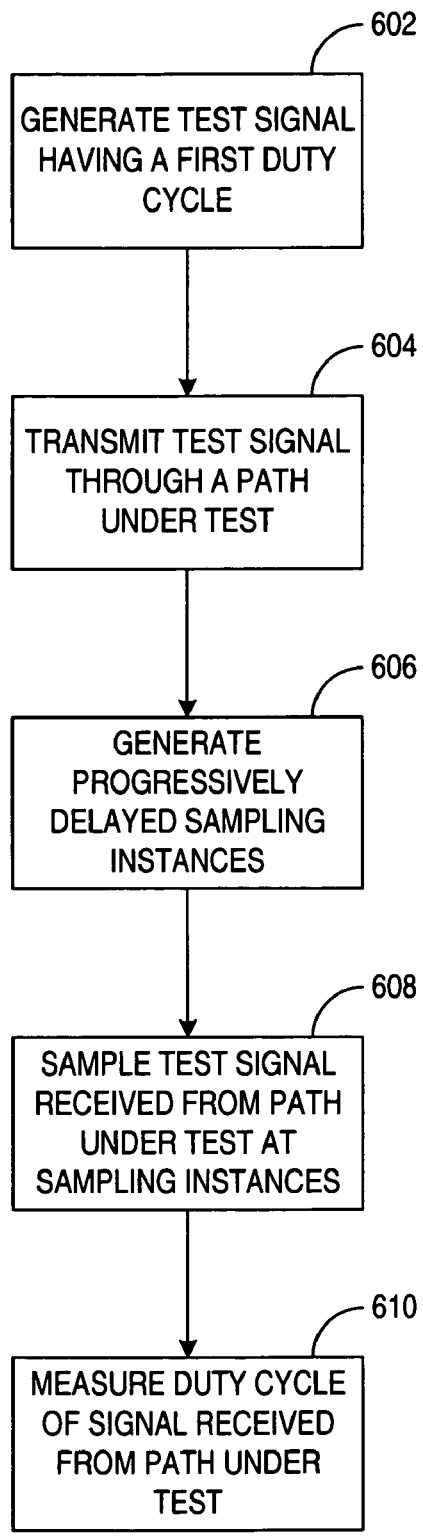
FIG. 6 illustrates an exemplary flow diagram in accordance with one embodiment of the present invention.

Turning to FIG. 6, an exemplary flow diagram in accordance with one embodiment of the present invention is illustrated. In step 602, a test signal having a first duty cycle is generated. In step 604, the test signal is transmitted through a path under test within an IC, such as an FPGA. The test signal is then received from the path under test and sampled in step 608 at progressively delayed sampling instances that are generated in step 606. In step 610, the duty cycle of the test signal is measured as discussed above.

In alternative embodiments, multiple test periods may be utilized in an effort to reduce the effects of non-deterministic effects. In particular, sampling clock jitter may alter the placement of the sampling instances within a particular test period, which may produce anomalous test results. By repeating the test periods, a collection of samples may be obtained for each sampling instance. The samples for each collection may then be averaged, or manipulated in some other fashion, so as to mitigate any non-deterministic effects.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of measuring a duty cycle of a test signal, comprising:
   generating a test signal having a first duty cycle;
   transmitting the test signal through a path under test;
   generating a sampling signal having a programmably variable phase offset with respect to the test signal;
   sampling the test signal received from the path under test at instances defined by progressively delayed transitions of the sampling signal; and
   measuring a second duty cycle from accumulated samples of the received test signal.

2. The method of claim 1, wherein generating the test signal comprises generating a 50% duty cycle test signal.

3. The method of claim 2, wherein generating the sampling signal comprises calculating a period of the test signal.

4. The method of claim 3, wherein generating the sampling signal further comprises generating the sampling signal having a period equal to the period of the test signal.

5. The method of claim 4, wherein generating the sampling signal further comprises:
   determining a number of delay increments of the sampling signal required during a test period; and
   dividing the period of the test signal by the number of delay increments required to determine a magnitude of delay used for each delay increment.

6. The method of claim 5, wherein generating the sampling signal further comprises delaying the sampling signal by the delay magnitude of each delay increment prior to sampling the test signal.

7. The method of claim 6, wherein measuring the second duty cycle comprises:
   counting a number of logic high valued samples taken during the test period;
   counting a total number of samples taken during the test period; and
   dividing the number of logic high valued samples by the total number of samples to obtain the second duty cycle.

8. The method of claim 7, further comprising comparing the first duty cycle to the second duty cycle to determine an amount of duty cycle distortion exerted by the path under test.

9. A duty cycle measurement circuit comprising:
   a clock generator adapted to provide a test signal having a first duty cycle;
   a signal path coupled to receive the test signal and adapted to provide the test signal having a second duty cycle;
   a delay circuit coupled to receive the test signal from the clock generator and adapted to provide a sampling clock signal in response to the test signal from the clock generator, the sampling clock signal exhibiting a programmable delay offset relative to the test signal from the clock generator; and
   a sampling circuit coupled to receive the test signal from the signal path and the sampling clock signal from the delay circuit and adapted to sample a logic level of the test signal from the signal path at instances defined by progressively delayed transitions of the sampling clock signal.

10. The duty cycle measurement circuit of claim 9, wherein the signal path comprises a combinatorial logic circuit having a propagation delay.

11. The duty cycle measurement circuit of claim 9, further comprising a counter coupled to the sampling circuit and adapted to count a number of logic high level samples of the test signal and further adapted to count a total number of samples of the test signal, wherein a ratio of the logic high level samples to the total number of samples equals the measured duty cycle.

12. A method of configuring a programmable logic device (PLD) to measure duty cycle distortion, the method comprising:
   defining a path under test within the PLD;
   configuring logic resources within the PLD to implement a test circuit coupled to the path under test; and
   activating the test circuit to transmit a test signal to an input of the path under test and to sample the test signal at the output of the path under test at progressively delayed sampling instances relative to the test signal, wherein the samples are compared to an expected sample set to determine the measure of duty cycle distortion.

13. The method of claim 12, wherein configuring logic resources within the PLD comprises configuring a first clock source coupled to the path under test to generate the test signal.

14. The method of claim 13, wherein configuring logic resources within the PLD further comprises configuring a second clock source to generate a sampling clock signal used to sample the test signal.

15. The method of claim 14, wherein configuring the second clock source to generate the sampling clock signal comprises configuring resources within the PLD to receive a reference clock signal and to generate the sampling clock signal exhibiting fixed amounts of delay with respect to the reference clock.

16. The method of claim 15, wherein configuring logic resources within the PLD further comprises configuring a sampling circuit coupled to the path under test and the second clock source.

17. The method of claim 16, wherein activating the test circuit comprises progressively selecting one of the fixed amounts of delay.

18. The method of claim 17, wherein activating the test circuit further comprises:
   receiving the sampling clock signal at the sampling circuit; and
   sampling a logic level of the test signal at the sampling circuit using the progressively delayed sampling clock signal.

19. The method of claim 18, wherein activating the test circuit further comprises:
   accumulating the samples taken at the sampling circuit using a counter configured within the PLD; and
   analyzing the accumulated samples using a processor configured within the PLD to determine the measure of duty cycle distortion.

20. The method of claim 18, wherein activating the test circuit further comprises:
   accumulating the samples taken at the sampling circuit using a counter configured external to the PLD; and
   analyzing the accumulated samples using a processor configured external to the PLD to determine the measure of duty cycle distortion.

* * * * *